(12) United States Patent
Ohmiya et al.

(10) Patent No.: US 7,557,904 B2
(45) Date of Patent: Jul. 7, 2009

(54) WAFER HOLDING MECHANISM

(75) Inventors: Naoki Ohmiya, Tokyo (JP); Satoshi Genda, Tokyo (JP); Noboru Takeda, Tokyo (JP); Koichi Takeyama, Tokyo (JP); Yukio Morishige, Tokyo (JP); Hiroshi Morikazu, Tokyo (JP); Hiroshi Nomura, Tokyo (JP)

(73) Assignee: Disco Corporation, Tokyo (JP)

( * ) Notice: Subject to any disclaimer, the term of this patent is extended or adjusted under 35 U.S.C. 154(b) by 244 days.

(21) Appl. No.: 11/360,814

(22) Filed: Feb. 24, 2006

(65) Prior Publication Data

US 2006/0203222 A1    Sep. 14, 2006

(30) Foreign Application Priority Data

Mar. 11, 2005  (JP)  ............... 2005-069117
Oct. 5, 2005  (JP)  ............... 2005-292307

(51) Int. Cl.
*B24B 7/00* (2006.01)
*B24B 9/00* (2006.01)
*H01L 21/00* (2006.01)
*B25B 11/00* (2006.01)
*G03B 27/58* (2006.01)

(52) U.S. Cl. ............... 355/72; 451/64; 451/1; 451/28; 269/21; 438/464

(58) Field of Classification Search ............... 438/464, 438/33; 269/21; 355/72; 451/5, 6, 28, 41, 451/64
See application file for complete search history.

(56) References Cited

U.S. PATENT DOCUMENTS

| | | | |
|---|---|---|---|
| 4,869,481 A * | 9/1989 | Yabu et al. | 269/21 |
| 5,840,614 A * | 11/1998 | Sim et al. | 438/464 |
| 6,382,609 B1 * | 5/2002 | Namioka et al. | 269/21 |
| 2003/0102682 A1 * | 6/2003 | Kurokawa | 294/64.1 |
| 2004/0211762 A1 * | 10/2004 | Sekiya et al. | 219/121.82 |

FOREIGN PATENT DOCUMENTS

JP    10-305420    11/1998

OTHER PUBLICATIONS

Kopitkovas et al., "Surface micromachining of UV transparent materials," 2004, Thin Solid Films 453-454. pp. 31-35.*

* cited by examiner

*Primary Examiner*—Alexander G Ghyka
*Assistant Examiner*—Leonard Chang
(74) *Attorney, Agent, or Firm*—Wenderoth, Lind & Ponack, L.L.P.

(57) ABSTRACT

A wafer holding mechanism for holding a wafer affixed to a frame with a tape utilizing a suction force. The wafer holding mechanism includes a suction body, a wafer holder with a holding surface for holding the wafer via the tape, and a suction unit with a suction portion disposed at an outer peripheral edge of the wafer holder. The suction portion transmits a suction force across the holding surface though the outer peripheral edge of the wafer holder such that when the suction portion is covered and sealed by the tape, the wafer holder is held at the suction unit and the wafer is held at the holding surface.

5 Claims, 9 Drawing Sheets

WAFER HOLDING MECHANISM

BACKGROUND OF THE INVENTION

1. Field of the Invention

The present invention relates to a holding mechanism for holding a wafer that is a target object to be processed.

2. Related Art

Conventionally, a wafer divided along predicted separation lines into individual devices such as ICs, LSIs and the like is cut by a cutting blade along the separation lines so that the wafer separates into individual devices. However, it is difficult for the cutting blade to dice the wafer into separate devices when, for example, the wafer is formed of a material high on the Moh's hardness scale, such as a sapphire substrate.

Accordingly, recently, a technique involving directing a pulse laser onto the separation lines, forming grooves in such separation lines and separating the wafer into the individual devices has been proposed (for example, JP-A-10-305420).

However, even with the use of a laser of a wavelength that has a high rate of absorption by the wafer, most of the light permeates the wafer and reaches a chuck table that suctionally holds the wafer in place, damaging the chuck table.

Moreover, when protective tape is affixed to the surface of the wafer, heating of the chuck table by the laser beam, heats the protective tape and causes it to melt, which not only makes it difficult to transport the wafer from the chuck table but also causes the melted protective tape to adhere to the chuck table, thereby dirtying the chuck table and adversely affecting future use.

At the same time, attempting to make the chuck table out of a material with a high rate of absorption of the laser beam makes it difficult to open fine holes in the material that are used to transmit a suction force to the wafer.

SUMMARY OF THE INVENTION

Accordingly, it is an object of the present invention to solve the above-described problems of the conventional art by preventing the holding table that holds a wafer from heating up when a laser is used to process the wafer.

To achieve the above-described object, the present invention provides a wafer holding mechanism for holding a wafer to be processed, including a wafer holder having a holding surface for holding the wafer; and a suction part formed on an outer peripheral side of said wafer holder, the wafer holding mechanism holding the wafer at said holding surface by a suction force transmitted to said holding surface from said suction part through an outer peripheral edge part of said wafer holder.

Preferably, a plurality of open grooves open to the outer peripheral edge part is formed in the holding surface, so that a suction force from the suction part is transmitted to the plurality of grooves to hold the wafer at the holding surface.

Preferably, the wafer forms a single unit with a frame through a tape. A frame support that supports the frame is provided on an outer peripheral side of the suction part, and the frame is supported at the frame support. The wafer is supported at the holding surface of the wafer holder. The suction part is covered and sealed by the tape.

Preferably, the wafer holder is made of quartz, boro-silicated glass, sapphire, calcium fluoride, lithium fluoride or magnesium fluoride.

Preferably, the wafer holder is transparent or semi-transparent, and has a light-emitting unit is provided on its back surface.

In the present invention, the wafer is suctionally held by the suction force transmitted to the holding surface from the suction part through the outer peripheral edge part of the wafer holder, and thus the wafer can be suctionally held in place without forming fine holes that penetrate the wafer holder from front to back. Therefore, the choice of materials for the wafer holder is not restricted by the need to form fine holes therein, and thus a material of good permeability and dispersibility with respect to the wavelength of the laser beam can be selected for the wafer holder. As a result, damage to the wafer holder from the laser beam can be prevented, as can melting of tape affixed to the wafer and the adherence of such melted tape to the wafer holder.

In addition, since there are multiple grooves open to the outer peripheral edge part of the holding surface, the suction force generated by the suction part is transmitted by the grooves, and the wafer is held on the holding surface. Thus, the wafer can be held more strongly in place.

Where the wafer forms a single unit with the frame through tape, the outer peripheral side of the suction part is provided with a frame support that supports the frame, and the suction part is covered and sealed by the tape, there is no need for to provide a mechanism for generating suction beneath the wafer holder, and the space formed thereby can be used effectively.

If the wafer holder is made of transparent or semi-transparent material, and a light-emitting unit is provided on the back side of the holding surface of the wafer holder, then when a die attach film affixed to the individual devices needs to be cut by illuminating the die attach film with the light emitting unit the location where the cut should be made can be clearly detected.

Other objects, features and advantages of the present invention will be apparent from the following description when taken in conjunction with the accompanying drawings, in which like reference characters designate the same or similar parts throughout the figures thereof.

DETAILED DESCRIPTION OF THE INVENTION

A detailed description will now be given of preferred embodiments of the present invention, with reference to the accompanying drawings.

Figure 1:
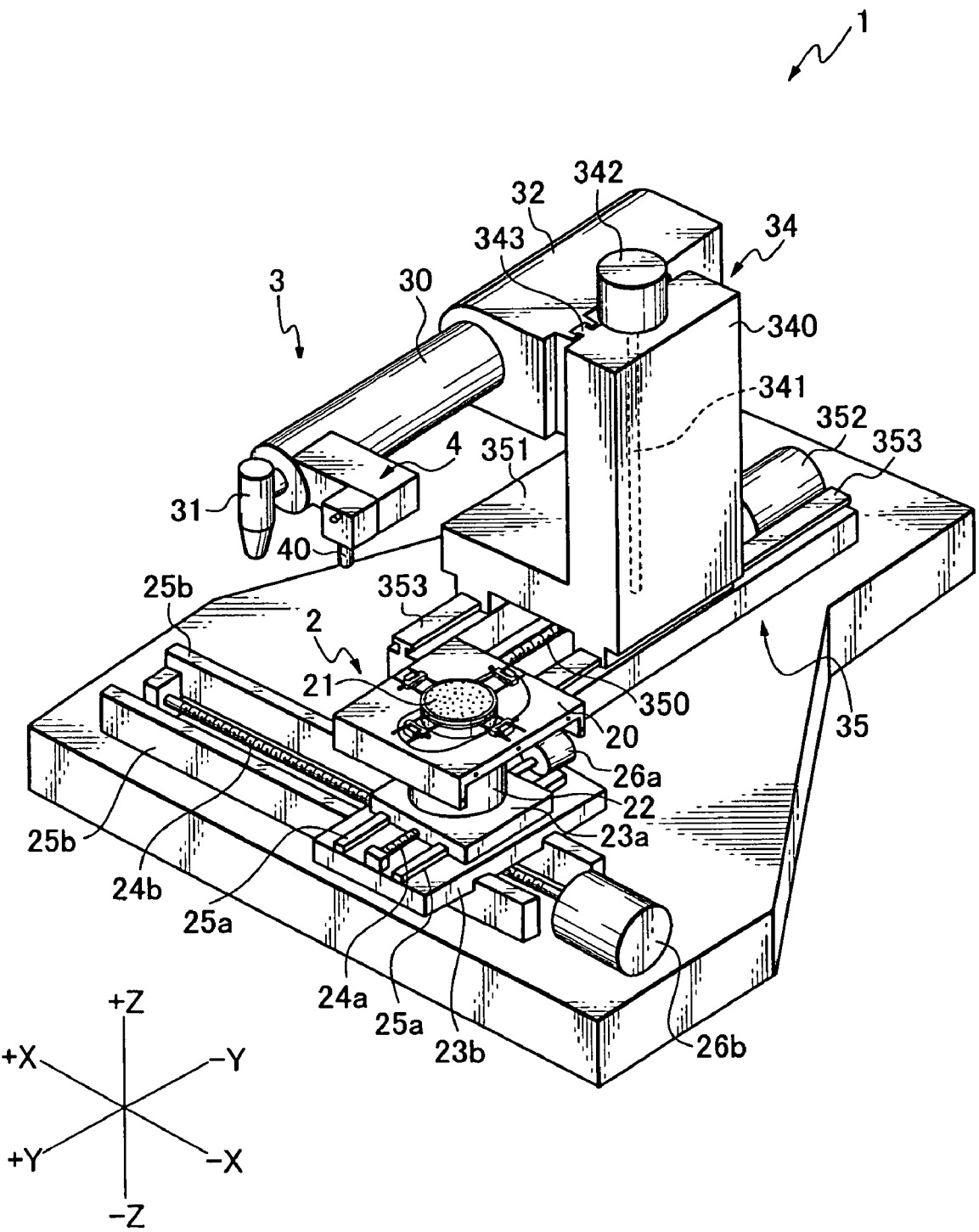
FIG. 1 is a perspective view showing one example of a laser processing apparatus.

The wafer holding mechanism according to the present invention may be applied, to a processing apparatus such as the laser processing apparatus 1 shown in FIG. 1. The laser processing apparatus 1 cuts through and opens holes in a wafer or other target object to be processed. As shown Apparatus 1 comprises a retention means 2 that holds the target object, and a processing means 3 that cuts through and opens holes in the target object with a laser beam.

The retention means 2 has a suction unit 21 that is rotatably supported on a support plate 20. The suction unit 21 is coupled to a drive source 22 so as to be rotatable. The drive source 22 is fixedly mounted on a movable base 23*a*. An internal nut of the movable base 23*a* engages a ball screw 24*a* disposed along the Y-axis so that the movable base 23*a* is slidable along a pair of guide rails 25*a* disposed parallel to the ball screw 24*a*. One end of the ball screw 24*a* is coupled to a motor 26*a*. As the ball screw 24*a* is driven by the motor 26*a* and rotates, the movable base 23*a* is guided by the guide rails 25*a* and moves in the direction of the Y-axis, and the suction unit 21 moves in the same direction.

In addition, the internal nut of the movable base 23*a* provided with the ball screw 24*a* and the guide rails 25*a* engages another ball screw 24*b* disposed along the X-axis so that the movable base 23*b* is slidable along a pair of guide rails 25*b* disposed parallel to the ball screw 24*b*. One end of the ball screw 24*b* is coupled to a motor 26*b*. As the ball screw 24*b* is driven by the motor 26*b* and rotates, the movable base 23*b* is guided by the guide rails 25*b* and moves in the direction of the X-axis, and the suction unit 21 moves in the same direction.

In the processing means 3, a processing head 31 is supported by a housing 30, and the housing 30 is supported by a support unit 32. The processing head 31 has the ability to emit a laser beam downward, the output of the output laser beam being adjusted by an output adjustment means. The output laser beam is a pulse laser beam that produces a laser beam by oscillation of an oscillation means. The oscillation means can create a pulse laser beam having a frequency that is set by a frequency setting means.

An alignment means 4 that detects predicted separation lines of a target object is fixedly mounted on a side part of the housing 30. The alignment means 4 comprises an image-sensing unit 40 that senses the target object. Based on an image acquired by the image sensing unit 40, the alignment means 40 determines where to make a cut or open a hole using pattern matching with a pre-stored image or the like.

The processing means 3 and the alignment means 4 are movable in the direction of the Z-axis by a Z-axis feed means 34. The Z-axis feed means 34 comprises a ball screw 341 disposed along the Z-axis in one surface of a wall part 340, a pulse motor 342 that rotates the ball screw 341, and a guide rail 343 disposed parallel to the ball screw 341, with an internal nut, not shown, of the support unit 32 engaging the ball screw 341. As the ball screw 341 is driven by the pulse motor 342 so as to revolve, the support unit 32 ascends and descends in the direction of the Z-axis while guided by the guide rail 343, and the processing means 3 supported by the support unit 32 ascends and descends in the same direction.

The wall part 340 is movable along the Y-axis by a Y-axis feed means 35. The Y-axis feed means 35 comprises a ball screw 350 disposed along the Y-axis, a movable base 351 that engages a nut internal to and forming a single unit with the wall part 340 that engages the ball screw 350, a pulse motor 352 that rotates the ball screw 350, and a pair of guide rails 353 disposed parallel to the ball screw 350. A nut, not shown, internal to the movable base 351 engages with the ball screw 350. As the ball screw 350 is driven and rotated by the pulse motor 352, the movable base 351 moves in the direction of the Y-axis while guided by the guide rails 353, and with it the processing means 3 also moves in the direction of the Y-axis.

Figure 2:
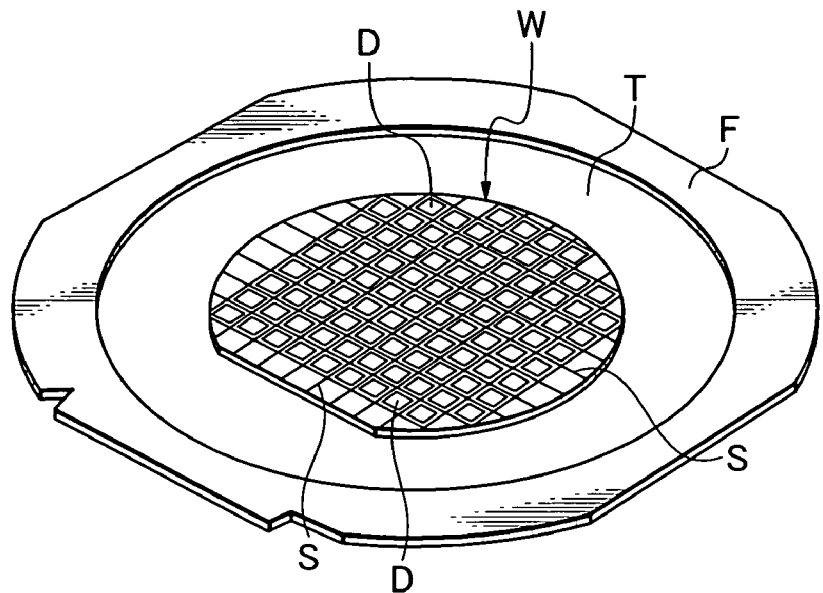
FIG. 2 is a perspective view showing a wafer forming a single unit with a frame via tape.

As the target object that is processed by the laser processing apparatus 1, there is, for example, a wafer W like that shown in FIG. 2. The wafer W is formed so as to be divided into a plurality of devices D along predicted separation lines. When the wafer W is diced, that is, cut along the longitudinal and latitudinal separation lines, the wafer is divided into individual devices D.

Figure 3:
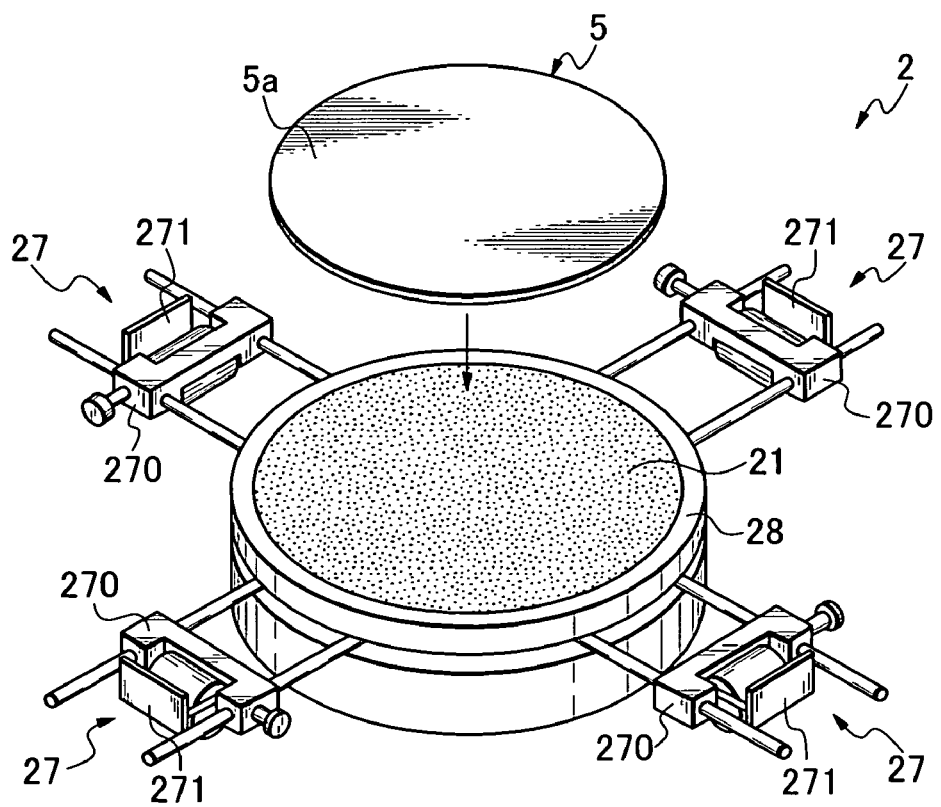
FIG. 3 is an exploded perspective view showing an example of a wafer holding mechanism.

If the wafer W is diced in a state in which, as shown in FIG. 2, a tape T is affixed from a back surface side of an annular frame F made of a metal such as stainless steel or the like so as to cover an opening in the frame F and the wafer W is affixed to an adhesive surface of the tape T, the wafer W forms a single unit with the frame F via the tape T, and frame supports 27 for fixedly mounting the frame F are provided on an outer peripheral side of the suction unit 21 as shown in FIG. 3.

The frame supports 27 are movable in the horizontal direction, and each comprises a support member 270 for supporting the frame F from below and a pressing member 271 for sandwiching the frame between itself and the support member 270. The pressing member 271 rotates with the injection of air, for example, between a retain position and a release position.

The suction unit 21 that forms part of the retention means 2 is disposed on an inner peripheral side of a framework 28. The suction unit 21 may, for example, be made of porous ceramic having multiple fine holes that penetrate the suction unit 21 from the front surface thereof to the back surface thereof.

Figure 4:
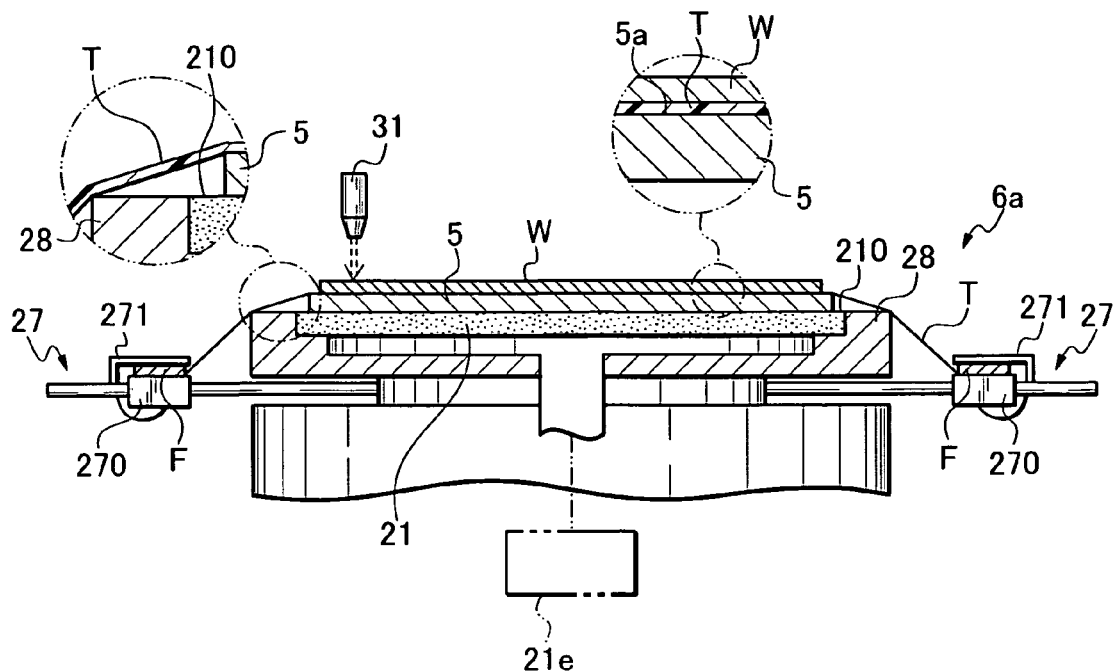
FIG. 4 is a cross-sectional view showing the holding mechanism holding a wafer.

As shown in FIG. 3, a wafer holder 5 is placed on the suction unit 21. The outer diameter of the wafer holder 5 is smaller than the outer diameter of the suction unit 21. The wafer holder 5 may be made, for example, of quartz, borosilicated glass, sapphire, calcium fluoride, lithium fluoride or magnesium fluoride.

Where a wafer W that forms a single unit with the frame F through the tape T as shown in FIG. 2 is held by the wafer holder 5, as shown in FIG. 4 the frame F is supported by the frame supports 27 and the wafer W is placed on a holding surface 5*a* of the wafer holder 5 across the tape T.

As shown in FIG. 4, the suction unit 21 communicates with a suction source 21*e* so that a suction force acts on a front surface of the suction unit 21. However, because the outer diameter of the wafer holder 5 is smaller than the outer diameter of the suction unit 21, a portion of the outer peripheral side of the suction unit 21 is exposed to form an exposed portion 210. At the same time, the frame F remains supported by the frame supports 27 and the tape T contacts an outer peripheral edge part of a top surface of the frame work 28, and thus the exposed portion 210 is sealed by the tape T. Therefore, the wafer holder 5 is suctionally held by the suction unit 21.

In addition, when the wafer W to which the tape T is affixed is placed on the wafer holder 5 and the suction force exerted on the wafer W, the space between the tape T and the holding surface 5a is decompressed and the tape T is sucked onto the holding surface 5a. In other words, the suction force at the exposed portion 210 is transmitted across the entire surface of the holding surface 5a through the outer peripheral edge part of the wafer holder 5 and the wafer W is held through the tape T. Thus, the wafer holder 5 is suctionally held in place by the suction unit 21, the wafer W is suctionally held to the holding surface 5a by the suction force at the exposed portion 210 that forms one part of the suction unit 21, and no air leak occurs. In this manner, the suction unit 21 and the wafer holder 5 form a wafer holding mechanism 6a.

To return to the description with reference to FIG. 1, by moving in the direction of the X-axis and in the direction of the Y-axis, the retention means 2 holding the wafer W via the wafer holder 5 as shown in FIG. 4 is positioned directly beneath the alignment means 4. Then after the separation lines S on the surface of the wafer W are detected by the image sensing unit 40, the retention means 2 is moved further along the +X-axis, and separation grooves are formed in the separation lines of the wafer W with a laser beam emitted from the processing head 31 that comprises the processing means 3.

A YV04 laser or a YAG laser may be used as the laser beam used for processing the wafer W. The parameters of the laser may be, for example, as follows: Wavelength 355 nm, output 3.0 W, repetition frequency 100 kHz, pulse duration 30 ns, processing feed speed 100 mm/s, spot diameter 10 μm.

The portion of the laser beam emitted from the processing head 31 that is not absorbed by the wafer W reaches the wafer holder 5. Therefore, if the wafer holder 5 is made of a material that is permeable to the laser beam and causes the laser beam to disperse, the wafer W can be divided into individual devices D without damaging the suction unit 21. For the material for the wafer holder 5 that is permeable to the laser beam and causes the laser beam to disperse, quartz, borosilicated glass, sapphire, calcium fluoride, lithium fluoride or magnesium fluoride may be selected.

Thus, as described above, the wafer W is suctionally held in place at the holding surface 5a of the wafer holder 5 by the suction force exerted from the outer peripheral side of the wafer holder 5, and processed by laser. As a result, the wafer can be suctionally held in place without forming fine holes in the wafer holder 5 that penetrate the wafer holder 5 from the front surface to the back surface. Accordingly, the choice of materials for the wafer holder is not restricted by the need to form fine holes therein, and thus a material of good permeability and dispersibility with respect to the wavelength of the laser light can be selected for the wafer holder.

Moreover, the suction force acting on the holding surface 5a of the wafer holder 5 is transmitted via the outer peripheral edge part of the wafer holder 5, and thus no force is exerted on the wafer holder 5 in a direction perpendicular to the wafer holder 5. Consequently, the wafer holder 5 may be made into a relatively thin approximately 0.5-2.0 mm plate of quartz or the like.

Figure 5:
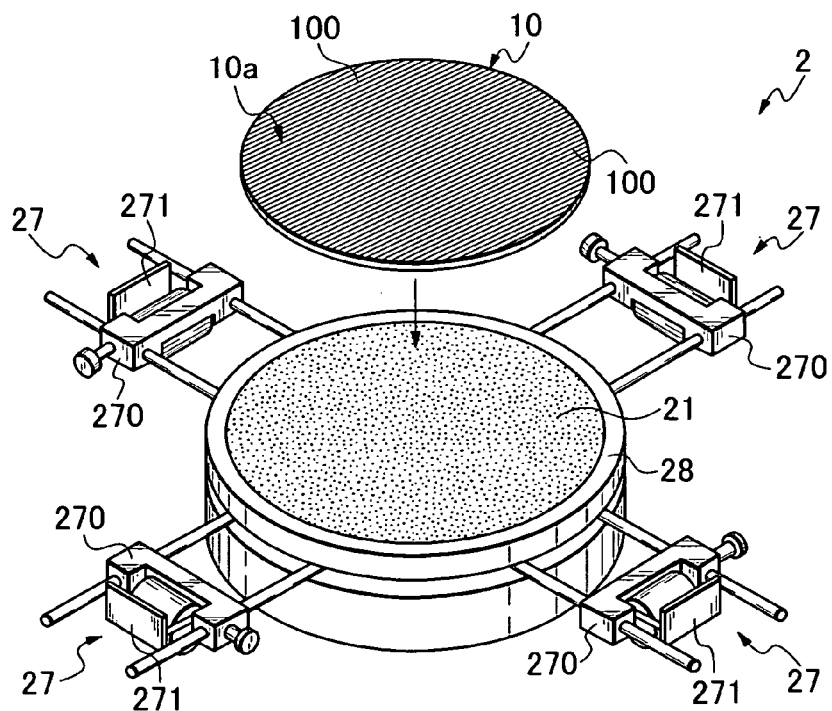
FIG. 5 is a perspective view showing an example of a wafer holding mechanism.

It should be noted that, as with a wafer holder 10 shown in FIG. 5, a plurality of grooves 100 open to a peripheral outer edge part of a holding surface 10a of the wafer holder 10 may be formed in the holding surface 10a of the wafer holder 10.

The grooves 100 may have such dimensions such as, for example, a depth of approximately 50-100 μm and a width of approximately 30-100 μm, with an interval between grooves of approximately 0.1-5.0 mm. In addition, the grooves 100 may have a 'V' shape or a "U" shape in cross-section. The grooves 100 may be formed using a cutting device such as a dicing device equipped with a cutting blade having an outer shape that corresponds to a desired inner shape of the grooves 100.

Figure 6:
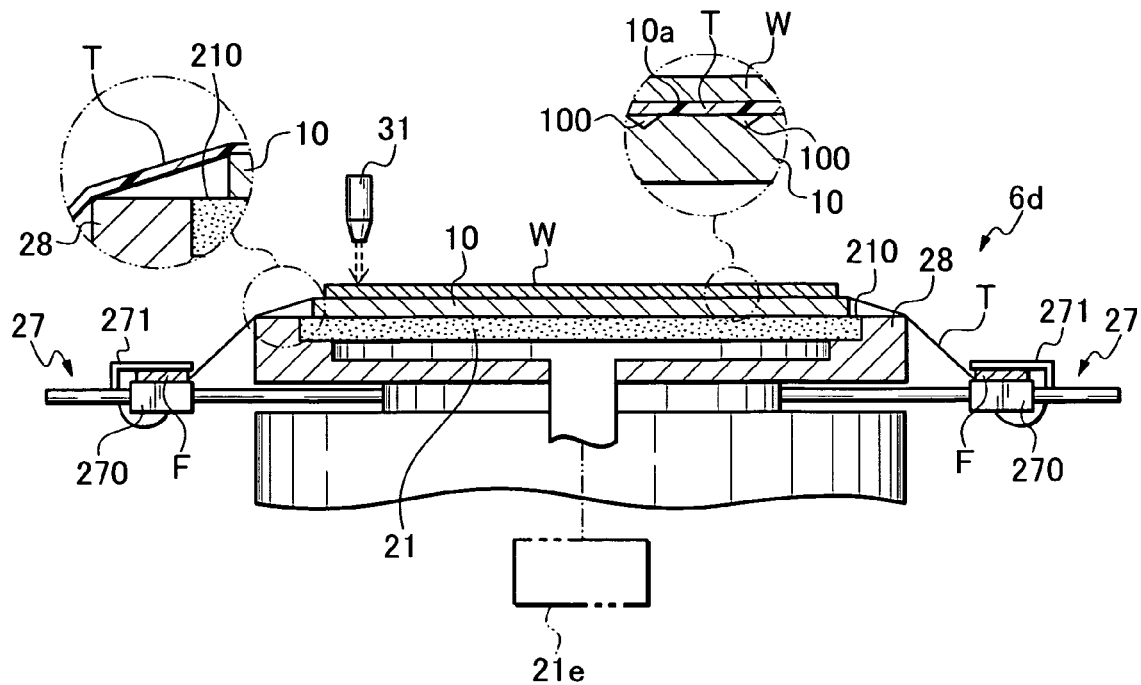
FIG. 6 is a cross-sectional view showing the holding mechanism holding a wafer.

When a wafer holder like the wafer holder 10 is used, then, as shown in FIG. 6, the suction force at the exposed portion 210 is transmitted to the grooves 100 as well through the outer peripheral edge part of the wafer holder 10, the space between the tape T and the holding surface 10a formed by the grooves 100 is decompressed and the wafer W is held to the holding surface 10a through the tape T. Thus, the wafer holder 10 is suctionally held in place by the suction unit 21, the wafer W is suctionally held to the holding surface 10a by the suction force at the exposed portion 210 that forms one part of the suction unit 21, and no air leak occurs. In this manner, the suction unit 21 and the wafer holder 10 form a wafer holding mechanism 6d.

In the above-described instance, provided that the grooves 100 are open to the outer peripheral edge part of the wafer holder 10, the grooves 100 may be approximately several μm deep, the interval between grooves may be freely set as desired, and the shape of the grooves is not limited to that shown in FIG. 6. Moreover, the grooves 100 need not be formed in a single direction only, and alternatively the grooves 100 may be formed in multiple directions so as to intersect. It should be noted that, in order to enhance the transmission of the suction force to the grooves, it is preferable to widen the width of the grooves at the outer peripheral edge part of the wafer holder 10.

Next, a description will be given of the wafer holding mechanism 6b shown in FIG. 7 and FIG. 8. In the wafer holding mechanism 6b shown in FIGS. 7 and 8, a holding surface 7a of a wafer holder 7 is formed flush with a top surface of a framework 29. In addition, an outer peripheral groove 29a is formed in the framework 29.

Figure 8:
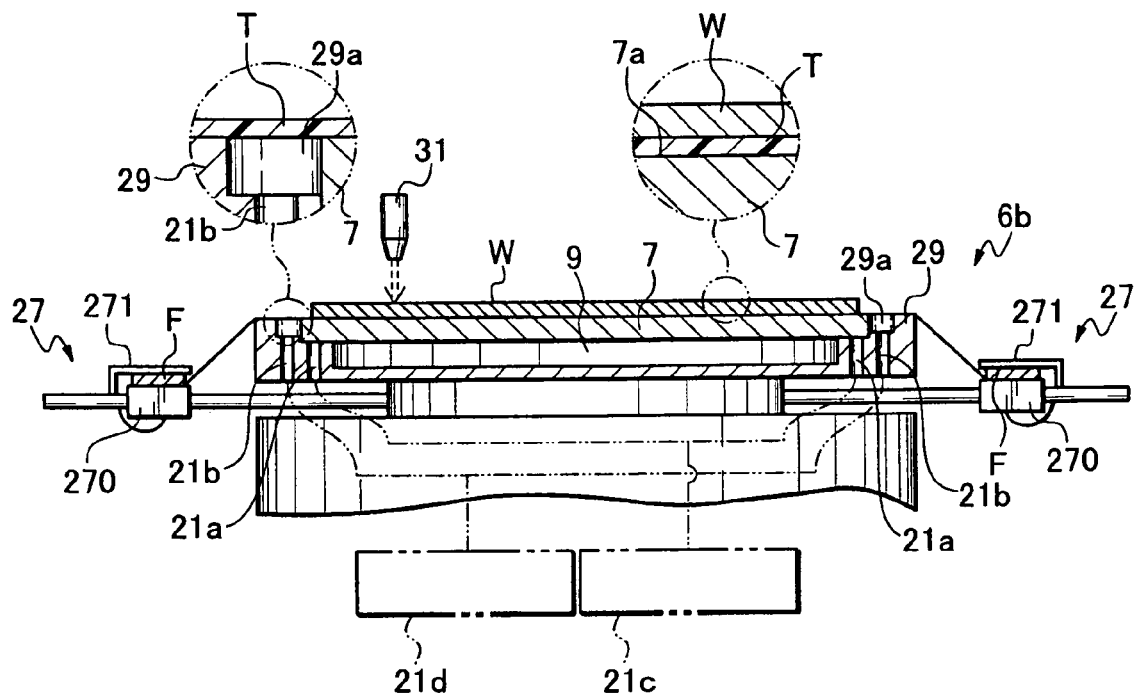
FIG. 8 is a cross-sectional view showing the holding mechanism holding a wafer.

As shown in FIG. 8, the wafer holder 7 is suctionally held in place by a first suction unit 21a that communicates with a first suction source 21c. A second suction unit 21b that communicates with a second suction source 21d is provided on an outer peripheral side of the wafer holder 7. The provision of frame supports 27 for fixedly mounting the frame F on an outer peripheral side of the framework 29 is the same as in the embodiments shown in FIGS. 3-6. What is different, however, is the formation of a space 9 beneath the wafer holder 7.

As shown in FIG. 8, the wafer holder 7 is suctionally held in place by the first suction unit 21a. In addition, when the frame F, with which the wafer W forms a single unit via the tape T is supported by the frame supports 27, the second suction unit 21b is sealed by the tape T. Then, when the wafer W with the tape T affixed is placed on the wafer holder 7 and a suction force is exerted thereon by the suction unit 21b, the space between the tape T and the holding surface 7a is decompressed and the tape T is sucked onto the holding surface 7a. In other words, the suction force of the second suction unit 21b is transmitted across the entire surface of the holding surface 7a through the outer peripheral edge part of the wafer holder 7 so as to hold the wafer W in place through the tape T. In this manner, the suction unit 21b and the wafer holder 7 form the wafer holding mechanism 6b.

When the wafer W is held by the wafer holding mechanism 6b in the foregoing manner and a laser beam from the processing head 31 is directed onto the predicted separate lines on the wafer W so as to form grooves in the separation lines, that portion of the laser beam emitted from the processing head 31 that is not absorbed by the wafer W reaches the wafer holder 7. As a result, provided that the wafer holder 7 is made of a material that is permeable to the laser beam and causes it to disperse, no damage is caused to either the first suction unit 21a that holds the wafer holder 7 in place or to the space 9 therebelow. Therefore, the space 9 can be effectively utilized for applications other than the holding of the wafer W.

For the material for the wafer holder 7 that is permeable to the laser beam and causes the laser beam to disperse, quartz, boro-silicated glass, sapphire, calcium fluoride, lithium fluoride or magnesium fluoride may be selected.

Thus, as described above, the wafer W is suctionally held in place at the holding surface 7a of the wafer holder 7 by the suction force exerted from the second suction unit 21b provided on the outer peripheral side of the wafer holder 7 and laser-processed. As a result, the wafer can be suctionally held in place without forming fine holes in the wafer holder 7 that penetrate the wafer holder 7 from the front surface to the back surface. Accordingly, the choice of materials for the wafer holder is not restricted by the need to form fine holes therein, and thus a material of good permeability and dispersibility with respect to the wavelength of the laser light can be selected for the wafer holder.

Figure 9:
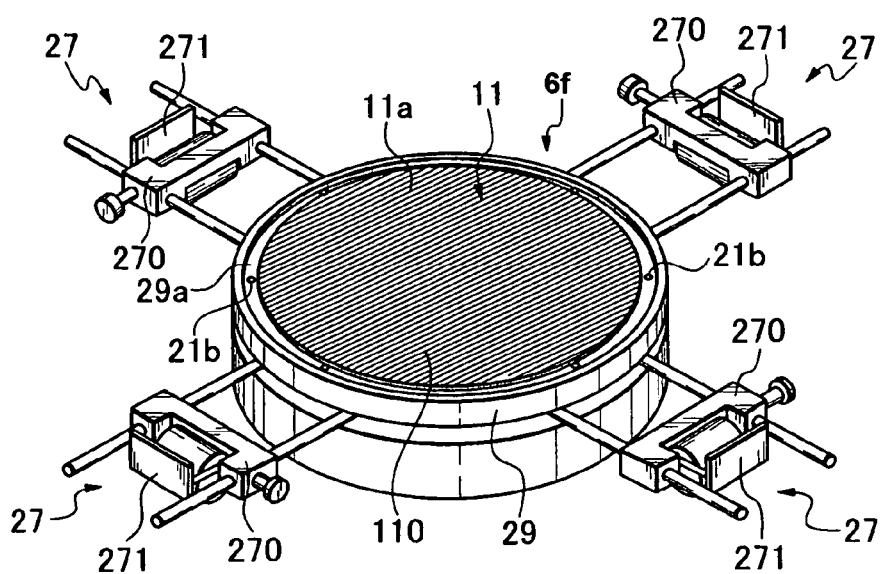
FIG. 9 is a perspective view showing an example of a wafer holding mechanism.

It should be noted that, as with a wafer holder 11 shown in FIG. 9, a plurality of grooves 110 open to a peripheral outer edge part of a holding surface 11a of the wafer holder 11 may be formed in the holding surface 11a of the wafer holder 11. The grooves 110 may have such dimensions as, for example, a depth of approximately 50-100 μm and a width of approximately 30-100 μm, with an interval between grooves of approximately 0.1-5.0 mm. In addition, the grooves 110 may have a 'V' shape or a "U" shape in cross-section. The grooves 110 may be formed using a cutting device such as a dicing device equipped with a cutting blade having an outer shape that corresponds to a desired inner shape of the grooves 110.

Figure 10:
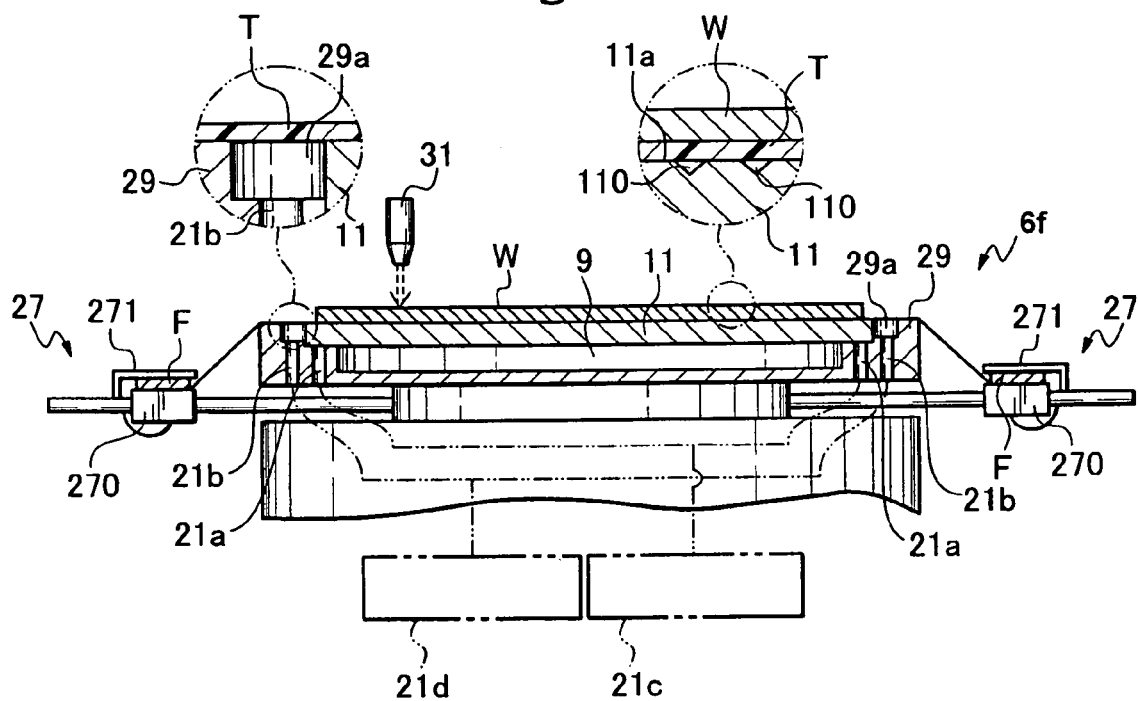
FIG. 10 is a cross-sectional view showing the holding mechanism holding a wafer.

In case the wafer holder 11 having a plurality of grooves 110 therein is used, as shown in FIG. 10, the suction force at the second suction unit 21b is transmitted to the grooves 110 as well through the outer peripheral edge part of the wafer holder 11, the space between the tape T and the holding surface 10a formed by the grooves 110 is decompressed and the wafer W is held to the holding surface 11a through the tape T.

Thus, the wafer holder 11 is suctionally held in place by the first suction unit 21a, the wafer W is suctionally held to the holding surface 11a by the suction force at the second suction unit 21b, and no air leak occurs. In this manner, the second suction unit 21b and the wafer holder 11 form the wafer holding mechanism 6f.

In the above-described instance, provided that the grooves 110 are open to the outer peripheral edge part of the wafer holder 11, the grooves 110 may be approximately several μm deep, the interval between grooves may be freely set as desired, and the shape of the grooves is not limited to that shown in FIG. 10. Moreover, the grooves 110 need not be formed in a single direction only, and alternatively the grooves 110 may be formed in multiple directions so as to intersect.

Next, a description will be given of a wafer holding mechanism 6c shown in FIG. 11 and FIG. 12.

Figure 7:
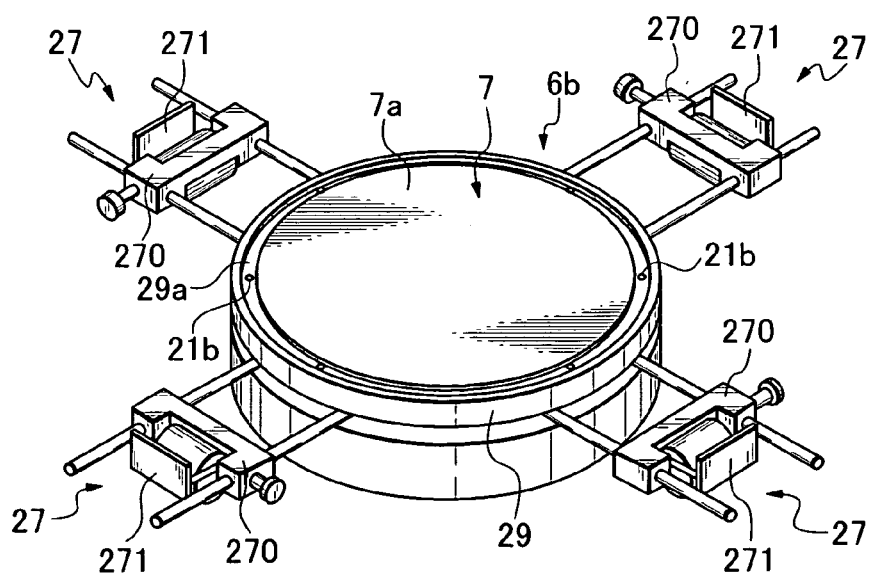
FIG. 7 is a perspective view showing an example of a wafer holding mechanism.
Figure 11:
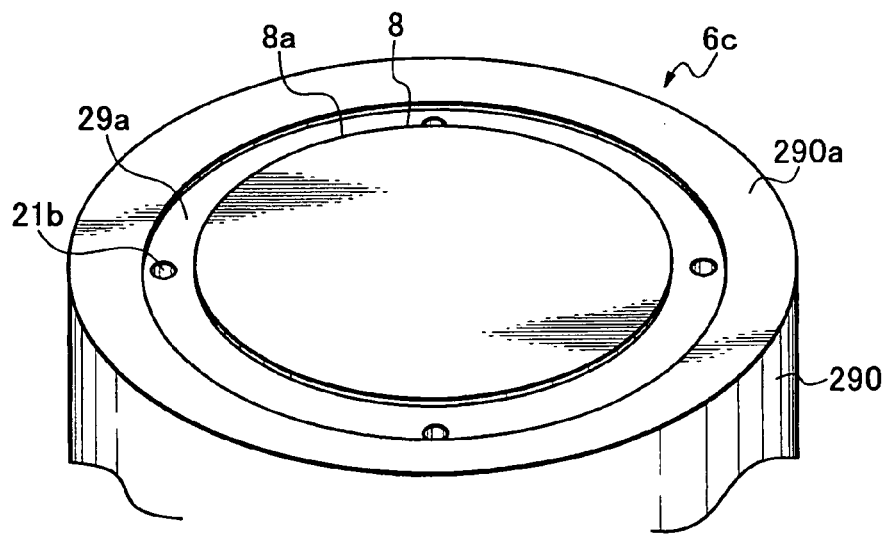
FIG. 11 is a perspective view showing an example of a wafer holding mechanism.
Figure 12:
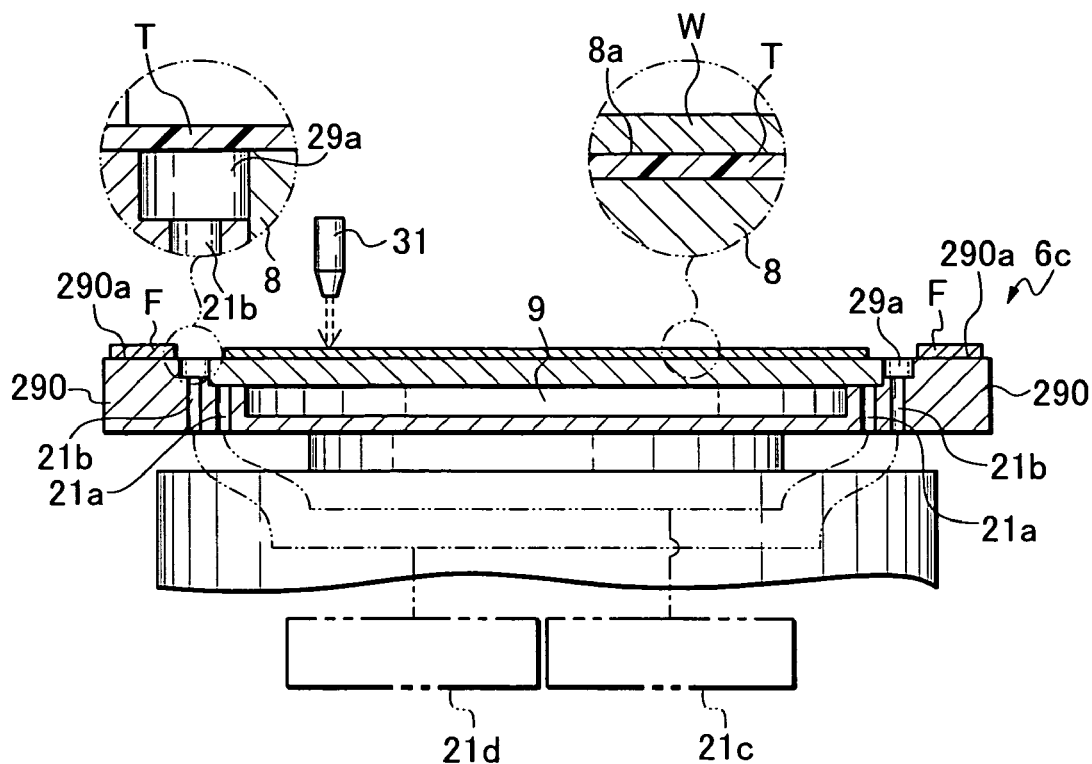
FIG. 12 is a cross-sectional view showing the holding mechanism holding a wafer.

Like the wafer holding mechanism 6b shown in FIGS. 7 and 8 and the wafer holding mechanism 6f shown in FIGS. 9 and 10, a holding surface 8a of a wafer holder 8 of a wafer holding mechanism 6c shown in FIGS. 11 and 12 is flush with a top surface of a framework 290 and the outer peripheral groove 29a is formed in the frame work 290. However, there is nothing corresponding to the frame supports 27 shown in FIGS. 7-10, and the top surface of the framework 290 functions as a frame support 290a that supports the frame F. If a magnet is built into the frame support 290a, the frame F can be held in palace by magnetic force of the magnet. Alternatively, the frame F may be held in place through suction holes.

As shown in FIG. 12, the wafer holder 8 is suctionally held in place by the first suction unit 21a that communicates with the first suction source 21c. The second suction unit 21b that communicates with the second suction source 21d is provided on an outer peripheral side of the wafer holder 8.

When the frame F, with which the wafer W forms a single unit via the tape T is supported by the frame support 290a, the second suction unit 21b is sealed by the tape T. Then, when the wafer W with the tape T affixed is placed on the wafer holder 8 and a suction force is exerted thereon by the suction unit 21b, the space between the tape T and the holding surface 8a is decompressed and the tape T is sucked onto the holding surface 8a. In other words, the suction force of the second suction unit 21b is transmitted across the entire surface of the holding surface 8a through the outer peripheral edge part of the wafer holder 8 so as to hold the wafer W in place through the tape T. In this manner, the suction unit 21b and the wafer holder 8 form the wafer holding mechanism 6c.

When the wafer W is held by the wafer holding mechanism 6c in the foregoing manner and a laser beam from the processing head 31 is directed onto the predicted separate lines on the wafer W so as to form grooves in the separation lines, that portion of the laser beam emitted from the processing head 31 that is not absorbed by the wafer W reaches the wafer holder 8. As a result, provided that the wafer holder 8 is made of a material that is permeable to the laser beam and causes it to disperse, no damage is caused to either the first suction unit 21a that holds the wafer holder 8 in place or to the space 9 therebelow. Therefore, the space 9 can be effectively utilized for applications other than the holding of the wafer W.

For the material for the wafer holder 8 that is permeable to the laser beam and causes the laser beam to disperse, it is possible to select as appropriate from among the quartz, boro-silicated glass, sapphire, calcium fluoride, lithium fluoride or magnesium fluoride may be selected.

Thus, as described above, the wafer W is suctionally held in place at the holding surface 8a of the wafer holder 8 by the suction force exerted from the second suction unit 21b provided on the outer peripheral side of the wafer holder 8 and laser-processed. As a result, the wafer can be suctionally held in place without forming fine holes in the wafer holder 8 that penetrate the wafer holder 8 from the front surface to the back surface. Accordingly, the choice of materials for the wafer holder is not restricted by the need to form fine holes therein, and thus a material of good permeability and dispersibility with respect to the wavelength of the laser light can be selected for the wafer holder 8.

Figure 13:
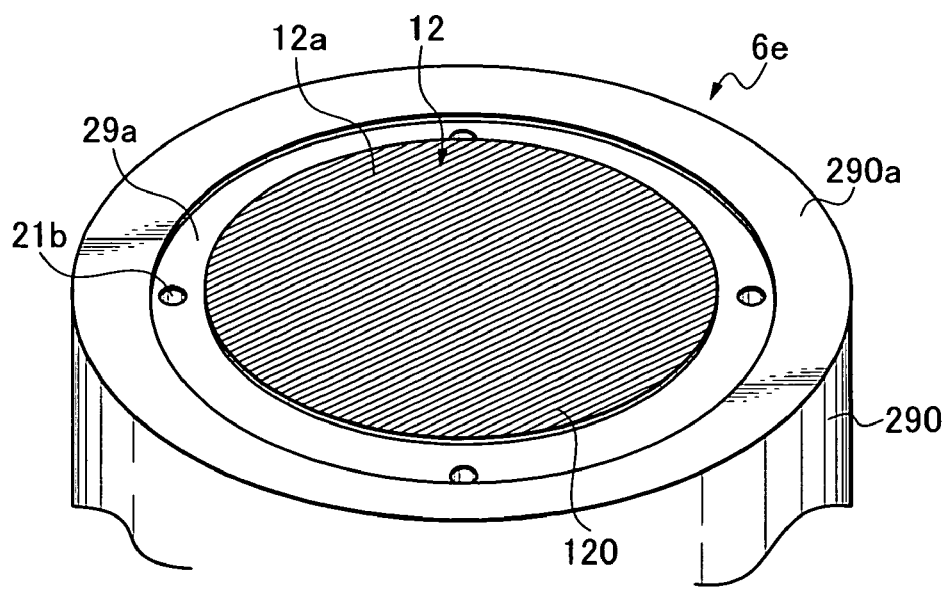
FIG. 13 is a perspective view showing an example of a wafer holding mechanism.
Figure 14:
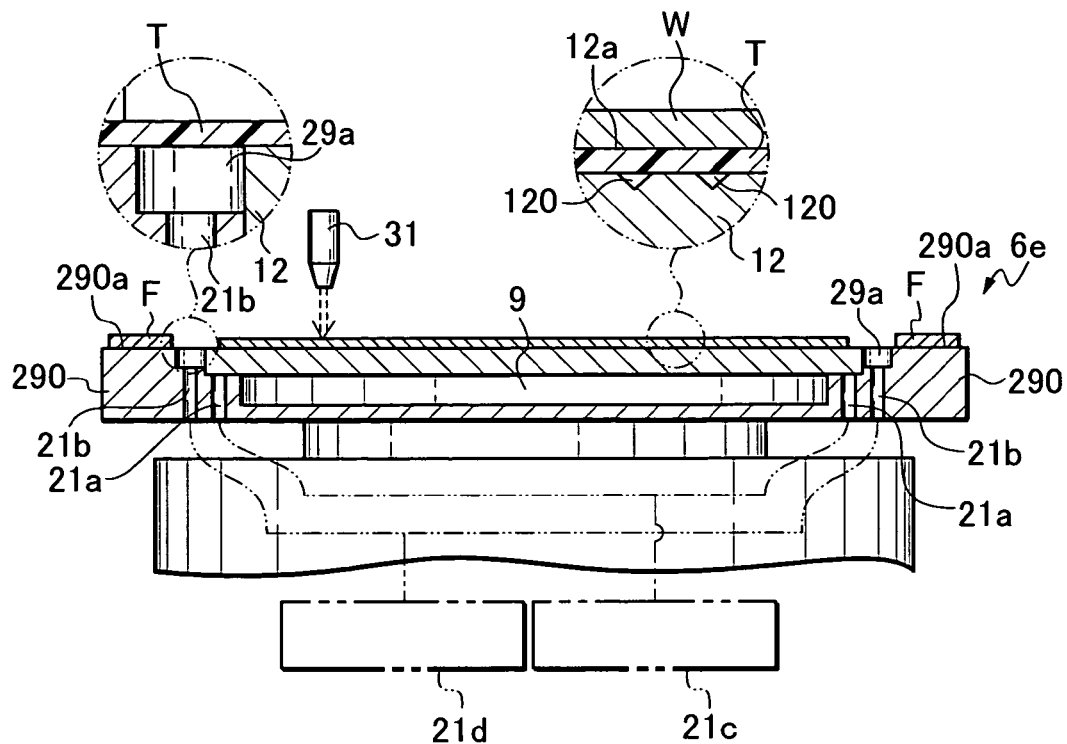
FIG. 14 is a cross-sectional view showing the holding mechanism holding a wafer.

It should be noted that, as with a wafer holder 12 shown in FIGS. 13 and 14, a plurality of grooves 120 open to a peripheral outer edge part of a holding surface 12a of the wafer holder 12 may be formed in the holding surface 12a of the wafer holder 12. The grooves 120 may have such dimensions as, for example, a depth of approximately 50-100 μm and a width of approximately 30-100 μm, with an interval between grooves of approximately 0.1-5.0 mm. In addition, the grooves 120 may have a 'V' shape or a "U" shape in cross-section. The grooves 120 may be formed using a cutting device such as a dicing device equipped with a cutting blade having an outer shape that corresponds to a desired inner shape of the grooves 110.

When the frame F is supported by the frame support 290a, the second suction unit 21b is sealed by the tape T. A plurality of grooves 120 is formed in the holding surface 12a of the wafer holder 12, and thus the suction force at the second suction unit 21b is transmitted to the grooves 120 via the external peripheral edge part of the wafer holder 12, the space between the back surface of the wafer W and the holding surface 12a on which is formed the grooves 120 is decompressed, and the wafer W is held to the holding surface 12a through the tape T.

Thus, the wafer holder 12 is suctionally held in place by the first suction unit 21a, the wafer W is suctionally held in place by the suction force at the second suction unit 21b and no air leak occurs. In this manner, the second suction unit 21b and the wafer holder 12 form a wafer holding mechanism 6e.

It should be noted that, provided that the grooves 120 are open to the outer peripheral edge part of the wafer holder 12, the grooves 120 may be approximately several μm deep and the shape of the grooves 120 is not limited to that shown in FIG. 14. Moreover, the grooves 120 need not be formed in a single direction only, and alternatively the grooves 120 may be formed in multiple directions so as to intersect.

After the wafer W is cut along its separation lines with a laser beam and divided into individual devices as described above, sometimes a thin film called a die attach film is affixed to the back surfaces of the devices. The die attach film functions as an adhesive agent during die bonding.

Figure 15:
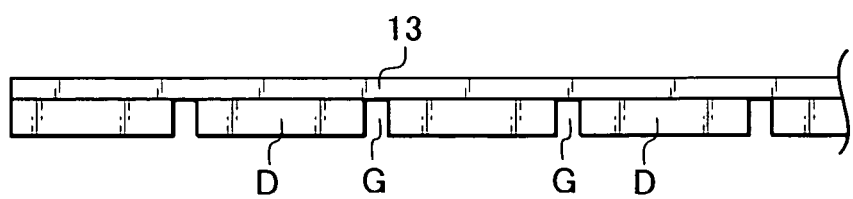
FIG. 15 is a front view showing a state in which die attach film is affixed to a device.
Figure 16:
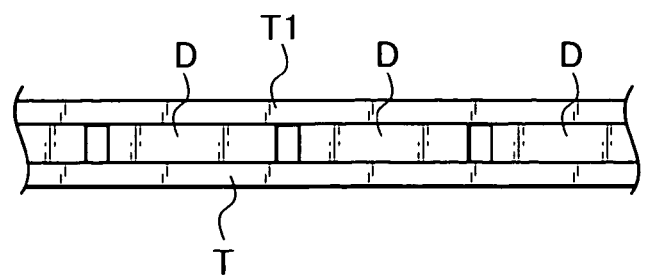
FIG. 16 is a front view showing a state in which tape is affixed to both sides of a device.
Figure 17:
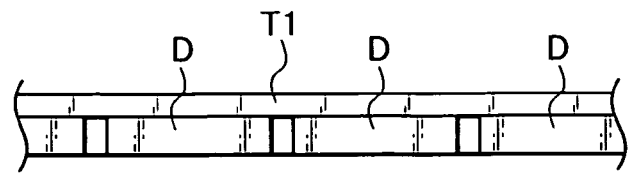
FIG. 17 is a front view showing a state in which tape is peeled off a back surface of a device.
Figure 18:
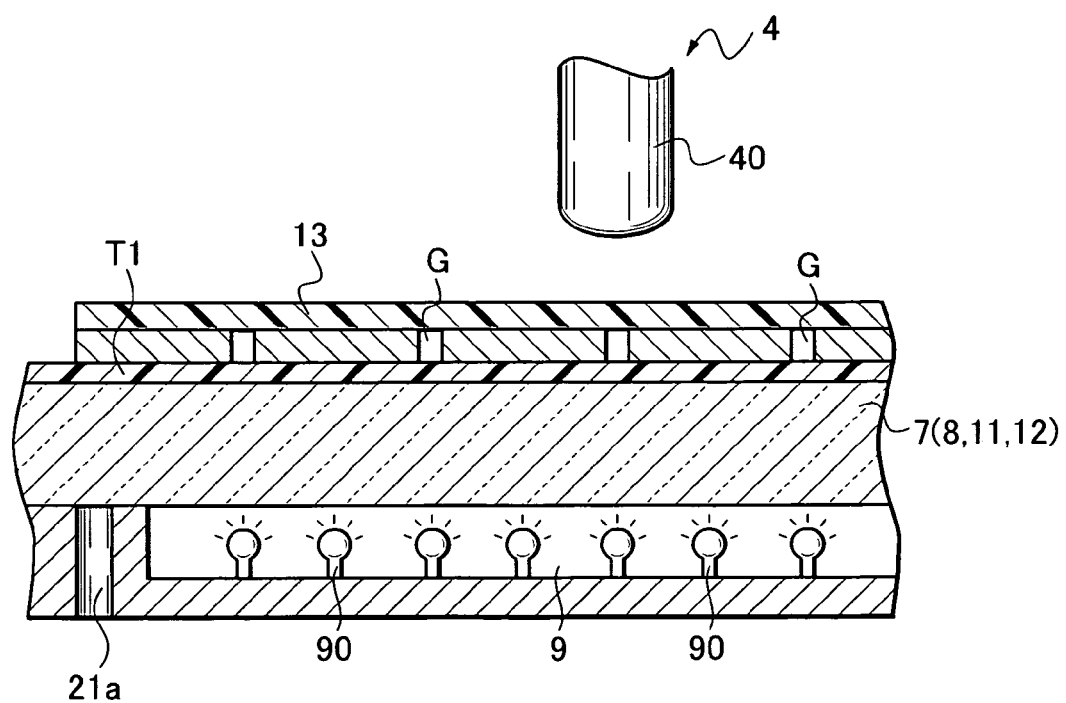
FIG. 18 is a cross-sectional schematic view showing a state in which the die attach film is illuminated by a light-emitting unit to detect separation grooves.

It is inefficient to attempt to affix the die attach film to individual devices and, therefore, typically a single large die attach film 13 is affixed to all the devices. The die attach film 13 is then cut along separation grooves G as shown in FIG. 15, so as to form devices D with die attach film 13 attached to back surface thereof.

Where separation grooves are formed by a laser beam on the wafer W with tape T affixed to the back surface side, as shown in FIG. 16 the frame to whose outer peripheral part the tape T1 is affixed freshly affixes the tape T1 to the front surface side of a plurality of devices (see FIG. 2). Further, as shown in FIG. 17, the tape T that was affixed to the back surface of the devices D is peeled off, after which the die attach film 13 is affixed to the back surface of the devices D. Then, as shown in FIG. 18, the tape T1 side is held in place by the wafer holder 7, the wafer holder 8, the wafer holder 11, and the wafer holder 12 shown in FIGS. 7-14.

Figure 19:
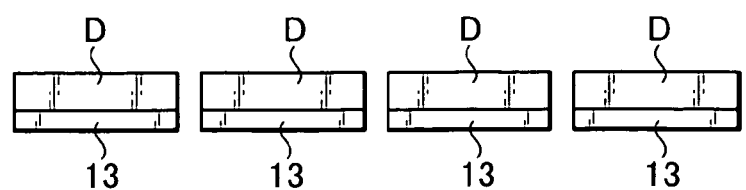
FIG. 19 is a front view showing a device in which the die attach film is affixed.

A laser processing apparatus like that used when cutting through the wafer W may be used to cut through the die attach film 13. In the examples shown in FIGS. 7 and 8, FIGS. 9 and 10, FIGS. 11 and 12 and FIGS. 13 and 14, a space 9 is formed beneath the respective wafer holders 7, 8, 11 and 12. As shown in FIG. 18, light-emitting units 90 such as LEDs may be provided in the space 9. In other words, in this case, the light emitting units 90 are provided in back of the wafer holders 7, 8, 11 and 12 to form the wafer holding mechanism.

Where light emitting units 90 are provided in the space 9, a transparent or a semi-transparent material is used for the wafer holders 7, 8, 11 and 12, such that, when the wafer holders 7, 8, 11 and 12 are lit and the die attach film 13 is illuminated, light leaking from the separation grooves G facilitates the identification and secure detection of the separation grooves G by the alignment means 4 when cutting through the diameter attach film 13. Then, by directing the laser beam directly onto the detected separation grooves G and cutting through the die attach film 13, and further by peeling off the tape T1, individual devices D with the die attach film 13 affixed to the back surface thereof are formed as shown in FIG. 19.

Although in the foregoing embodiments descriptions are given of instances in which the Tape T is affixed to the back of the wafer W and separation grooves formed thereon, in some cases the tape T is affixed to the front of the wafer W and the separation grooves formed thereon. In this case, the die attach film 13 is affixed to the back of the devices D while the tape T remains affixed to the front of the devices D, and the tape T side is held in place by the wafer holders 7, 8, 11 or 12, respectively. The light emitting units 90 are then lit to facilitate identification of the separate grooves as described above and the die attach film 13 is cut.

In addition, where grooves having a depth that corresponds to the thickness of the finished devices D are formed in the front of the wafer W and the wafer is ground from the back so as to expose the grooves from the back and thus divide the wafer W into individual devices D by a so-called DBG (Dicing Before Grinding) technique that divides the wafer W into individual devices, the tape T is affixed to the front of the wafer W and the devices D as a whole maintain the shape of the wafer W, and therefore the die attach film 13 is affixed to the back of the devices with the tape T affixed to the front of the wafer W and the tape T side of the wafer W is held in place by the wafer holders 7, 8, 11 and 12, respectively. The light emitting units 90 are then lit to facilitate identification of the separate grooves as described above and the die attach film 13 is cut.

Although in the foregoing embodiments the wafer is cut and separated into individual devices using a laser beam, processing by laser beam also includes opening holes, such as that performed when the devices that comprise the wafer are built up in layers. Moreover, provided that the wafer holder is made larger than the wafer, the wafer can be over-run and the laser beam dispersed.

As many apparently widely different embodiments of the present invention can be made without departing from the spirit and scope thereof, it is to be understood that the invention is not limited to the specific embodiments thereof except as defined in the appended claims.

What is claimed is:

1. A wafer holding mechanism for holding a wafer affixed to a frame with a tape, said wafer holding mechanism comprising:
   a suction framework;
   a suction unit disposed on said suction framework, said suction unit having a suction portion for transmitting a suction force; and
   a wafer holder disposed on said suction unit, said wafer holder being a ductless unit having an outer peripheral edge, and a holding surface for receiving the tape to hold the wafer via the tape, wherein:
   said wafer holder is made of quartz, boro-silicated glass, sapphire, calcium fluoride, lithium fluoride, or magnesium fluoride,
   said holding surface comprises a plurality of open grooves having a depth of 50 μm-100 μm and a width of 50 μm-100 μm, said grooves being open to said outer peripheral edge of said wafer holder and spaced apart by 0.1 mm-5.0 mm, and
   said suction portion is located at said outer peripheral edge of said wafer holder to transmit the suction force across said holding surface through said outer peripheral edge such that when the tape is placed on said holding surface, said suction portion and said wafer holder are covered and sealed by the tape to cause said wafer holder to be held at said suction unit and the wafer to be held at said holding surface by the suction force.

2. The wafer holding mechanism according to claim 1, further comprising a frame support for supporting the frame, said frame support being provided at an outer peripheral side of said suction portion.

3. The wafer holding mechanism according to claim 1, wherein said wafer holder is transparent or semi-transparent, and a light-emitting unit is provided on a back surface of said wafer holder.

4. The wafer holding mechanism according to claim 1, wherein said suction portion is formed only at said outer peripheral edge of said wafer holder.

5. The wafer holding mechanism according to claim 1, wherein said open grooves are linear.

* * * * *